(12) United States Patent
Mallala et al.

(10) Patent No.: US 11,894,817 B2
(45) Date of Patent: Feb. 6, 2024

(54) SLEW BOOST CIRCUIT FOR AN OPERATIONAL AMPLIFIER

(71) Applicant: TEXAS INSTRUMENTS INCORPORATED, Dallas, TX (US)

(72) Inventors: Suresh Mallala, Hyderabad (IN); Nitin Agarwal, Bengaluru (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 18/175,828

(22) Filed: Feb. 28, 2023

(65) Prior Publication Data

US 2023/0208369 A1 Jun. 29, 2023

Related U.S. Application Data

(63) Continuation of application No. 17/146,523, filed on Jan. 12, 2021, now Pat. No. 11,595,011, which is a continuation of application No. 16/377,462, filed on Apr. 8, 2019, now Pat. No. 10,924,074.

(51) Int. Cl.
*H03F 3/45* (2006.01)
*H03F 3/30* (2006.01)

(52) U.S. Cl.
CPC ....... *H03F 3/45192* (2013.01); *H03F 3/3066* (2013.01); *H03F 2200/372* (2013.01); *H03F 2203/45248* (2013.01)

(58) Field of Classification Search
CPC ............................ H03F 3/45192; H03F 3/3066
USPC ......................................................... 330/253
See application file for complete search history.

(56) References Cited

U.S. PATENT DOCUMENTS

| 7,342,450 | B2 | 3/2008 | Jones | |
|---|---|---|---|---|
| 2002/0109547 | A1 | 8/2002 | Ivanov et al. | |
| 2005/0285676 | A1 | 12/2005 | Jones | |
| 2007/0241818 | A1* | 10/2007 | Alenin | H03F 3/45094 330/257 |
| 2008/0180174 | A1 | 7/2008 | Kim et al. | |
| 2009/0039961 | A1* | 2/2009 | Damitio | H03F 3/3069 330/285 |
| 2009/0322429 | A1 | 12/2009 | Ivanov et al. | |
| 2012/0086509 | A1 | 4/2012 | Snoeij et al. | |
| 2013/0194251 | A1* | 8/2013 | Cheng | G09G 3/3648 345/92 |
| 2015/0091647 | A1* | 4/2015 | Kumar | H03F 3/45179 330/257 |
| 2017/0032755 | A1 | 2/2017 | Ko et al. | |

(Continued)

*Primary Examiner* — Patricia T Nguyen
(74) *Attorney, Agent, or Firm* — Krista Y. Chan; Frank D. Cimino

(57) ABSTRACT

A differential input stage of a circuit includes a first transistor, a second transistor, a third transistor, and a fourth transistor. Drains of the first and third transistors couple together at a first node, and drains of the second and fourth transistors couple together at a second node. A first slew boost circuit includes a fifth transistor and a first current mirror. A gate of the fifth transistor couples to the second node. A source of the fifth transistor couples to the first node. The first current mirror couples to the fifth transistor and to the second node. A second slew boost circuit includes a sixth transistor and a second current mirror. A gate of the sixth transistor couples to the first node. A source of the sixth transistor couples to the second node. The second current mirror couples to the sixth transistor and to the first node.

20 Claims, 2 Drawing Sheets

(56) References Cited

U.S. PATENT DOCUMENTS

| | | |
|---|---|---|
| 2017/0086269 A1 | 3/2017 | Wang |
| 2018/0269816 A1* | 9/2018 | Chen et al. |
| 2019/0190471 A1* | 6/2019 | Snoeij .................... H03F 3/165 |
| 2020/0228066 A1* | 7/2020 | Shankar ................ H03F 1/0211 |
| 2021/0056907 A1* | 2/2021 | Hatanaka ............. G09G 3/3258 |
| 2022/0122542 A1 | 4/2022 | Kim et al. |

* cited by examiner

US 11,894,817 B2

SLEW BOOST CIRCUIT FOR AN OPERATIONAL AMPLIFIER

CROSS-REFERENCE TO RELATED APPLICATION

This application is a continuation of U.S. patent application Ser. No. 17/146,523 filed Jan. 12, 2021, which is a continuation of U.S. patent application Ser. No. 16/377,462, filed Apr. 8, 2019 (now U.S. Pat. No. 10,924,074), each of which is hereby incorporated by reference in its entirety.

BACKGROUND

The "slew rate" of an operational amplifier is a measure of how fast the amplifier can charge a capacitor that is connected to an output node of the amplifier in response to a large change (increase or decrease) of the input signal to the amplifier. More generally, the slew rate is a measure of the maximum rate of change of the output voltage of the amplifier in response to an input step change.

One technique to increase the slew rate of an operational amplifier is to increase the bias current of the operational amplifier's input stage. Unfortunately, increasing the input stage's bias current causes an increase in the bandwidth of the amplifier, which in turn requires an increase of the compensation capacitance of the output stage to improve circuit stability. Increasing the compensation capacitance, however, results in a decrease of the slew rate. Further, increasing the bias current of the input stage of a folded cascode operational amplifier requires a commensurate increase in the current of the output stage, which in turn adds to the total input referred noise.

SUMMARY

In one example, a circuit includes a differential input stage. The differential input stage includes a first transistor, a second transistor, a third transistor, and a fourth transistor. Drains of the first and third transistors are coupled together at a first node, and drains of the second and fourth transistors are coupled together at a second node. An output stage also included and is coupled to the input stage. First and second slew boost circuits are included as well. The first slew boost circuit includes a fifth transistor and a first current mirror. A gate of the fifth transistor is coupled to the second node. A source of the fifth transistor is coupled to the first node. The first current mirror is coupled to the fifth transistor and to the second node. The second slew boost circuit includes a sixth transistor and a second current mirror. A gate of the sixth transistor is coupled to the first node. A source of the sixth transistor is coupled to the second node. The second current mirror is coupled to the sixth transistor and to the first node.

BRIEF DESCRIPTION OF THE DRAWINGS

For a detailed description of various examples, reference will now be made to the accompanying drawings in which.

DETAILED DESCRIPTION

The operational amplifier described herein includes a differential input stage coupled to an output stage. The differential input stage includes a pair of slew boost circuits—one slew boost circuit configured to temporarily increase the current through a compensation capacitor when a voltage on the first input of the input stage is greater than a voltage on the second input of the input stage, and another slew boost circuit configured to temporarily increase the current through the compensation capacitor when the voltage on the second input is greater than that on the first input. The slew boost circuits are coupled to the input and output stages of the operational amplifier. In addition to the current path through the differential input stage transistors, each slew boost circuit provides a current path for the compensation capacitor, thereby causing the charge or discharge current to/from the compensation capacitor to be larger than would have been the case without the slew boost circuits.

The slew boost circuits thus increase the compensation capacitor's charge/discharge current which results in larger rate of change of the voltage across the compensation capacitor. Because one terminal of the compensation capacitor is the output node of the operational amplifier, the output voltage from the operational amplifier can change at a faster rate and thus the slew rate of the operational amplifier increases. An advantage of the disclosed slew boost circuits is that during steady state operation (i.e., when the inputs to the operational amplifier have approximately the same voltage and are not experiencing a step change), the slew boost circuits have little or no current flow. Thus, the quiescent current of the operational amplifier is not increased due to the inclusion of the slew boost circuits.

Figure 1:
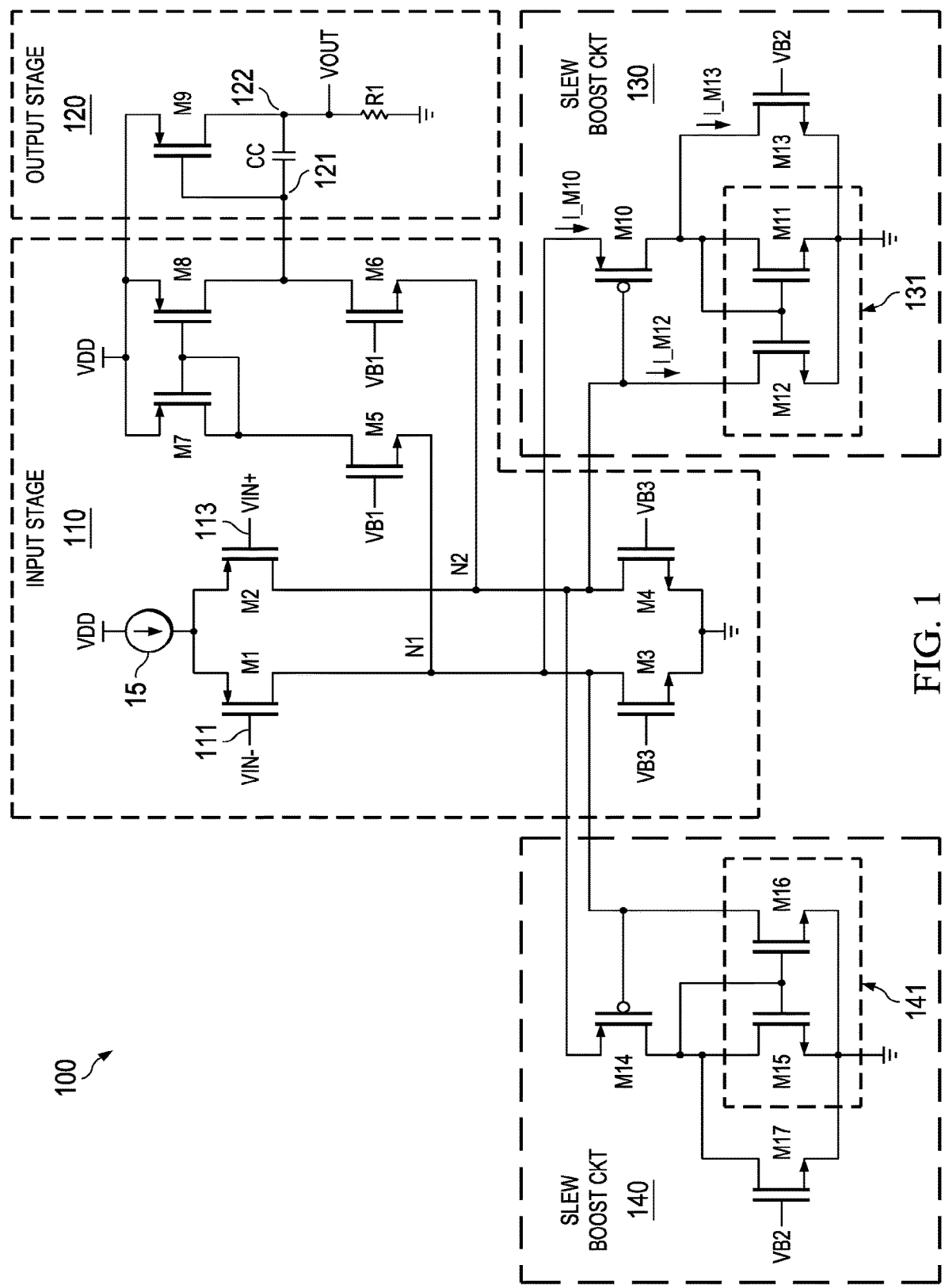
FIG. 1 illustrates a circuit (e.g., an operational amplifier) that includes slew boost circuits to increase the slew rate of the circuit.

FIG. 1 shows an example of operational amplifier 100 including a complementary folded cascode input stage 110, an output stage 120, and slew boost circuits 130 and 140. The transistors in the example implementation of FIG. 1 comprise metal oxide semiconductor field effect transistors (MOSFETs), but can include other types of transistors in other example implementations (e.g., bipolar junction transistors). Further, while each transistor in the example of FIG. 1 is shown as either an n-type MOSFET (NMOS) or a p-type MOSFET (PMOS), in other examples, NMOS devices can be substituted for NMOS devices, and vice versa.

The input stage 110 comprises a differential input stage and has a first input node 111 (VIN−) and a second input node 113 (VIN+). The input stage 110 in this example includes a pair of PMOS transistors M1 and M2 having their sources connected to a tail current source 15. The gates of input transistors M1 and M2 are connected to the input nodes 111 and 113, respectively. The drain of input transistor M1 is connected to the drain of current source transistor M3 (NMOS) at node N1, and the source of M3 is connected to the ground node. The drain of input transistor M2 is connected to the drain of current source transistor M4 (NMOS) at node N2, and the source of M4 is connected to the ground node. The gates of M3 and M4 are biased at a positive voltage level (VB3). M3 and M4 are current source transistors and pass some or all of the tail current from tail current source 15 to ground. The gates of current source transistors M3 and M5 are connected to a common bias voltage.

The drains of current source transistors M3 and M4 are connected to the sources NMOS cascode transistors M5 and M6, respectively. The gates of cascode transistors M5 and M6 are connected to a reference voltage VB1. The drain of cascode transistor M5 is connected to the drain of PMOS transistor M7 and to the gates of M7 and M8. The sources of M7 and M8 are connected to the supply voltage node VDD. M7 and M8 form a current mirror.

The output stage 120 in this example is implemented as a class A output stage (common source amplifier with a resistor as a load), but can be other types of output stages in other examples (e.g., a class AB output stage). The output stage 120 includes PMOS transistor M9, resistor R1, and compensation capacitor CC. The source of M9 is connected to the supply voltage node VDD. The gate of M9 is connected to terminal 121 of CC, and to the drains of M6 and M8. The drain of M9 is connected to the opposing terminal 122 of CC and to the resistor R1, the opposing terminal of which is connected to the ground node. The voltage on terminal 122 of CC (which is also connected to the drain of M9 and resistor R1) is the output voltage (VOUT) of the operational amplifier. In one implementation, the output voltage VOUT is provided as the VIN− voltage to input node 111. As such, the operational amplifier 100 operates in a closed-loop configuration.

The operational amplifier 100 also includes slew boost circuits 130 and 140. Each of the slew boost circuits 130 and 140 is coupled to the differential input stage 110 and to the output stage 120 at nodes N1 and N2 as shown. The slew boost circuits 130 and 140 have the same general circuit architecture. Slew boost circuit 130 includes a PMOS transistor M10, a current mirror 131, and transistor M13. Current mirror 131 includes NMOS transistors M12 and M12. The source of M10 is connected to node N1, and the gate of M10 is connected to node N2 and to the drain of M12. The drain of M10 is connected to the drain of M11, to the gates of M11 and M12, and to the drain of M13. The sources of M11, M12, and M13 are connected to the ground node. The gate of M13 is connected to a bias voltage VB2.

Slew boost circuit 140 includes a PMOS transistor M14, a current mirror 141, and transistor M17. Current mirror 141 includes NMOS transistors M15 and M16. The source of M14 is connected to node N2, and the gate of M14 is connected to node N1 and to the drain of M16. The drain of M14 is connected to the drain of M15, to the gates of M15 and M16, and to the drain of M17. The sources of M15, M16, and M17 are connected to the ground node. The gate of M17 is connected to the bias voltage VB2.

To aid in understanding the operation of the slew boost circuits 130 and 140, it may be helpful to understand the operation of the operational amplifier 100 without the slew boosting functionality of the slew boost circuits 130, 140. If the VIN+ input voltage on input node 113 experiences a large positive transition relative to the VIN− input voltage on input node 111, most or all of the tail current from tail current source 15 will flow through M1 and into the drain of M3. As the current into current source transistor M3 is constant, an increase in current through M1 will result in a decrease in the amount of current flowing through cascode transistor M5, and thus a commensurate decrease in current through M7 as well as current mirror pair transistor M8. As a result of less current flowing through M8, the voltage on the drain of M8 will be decreased, which in turn drives M9 on harder thereby causing more current flow through M9 into R1. As a result of the increased current flow through R1, the voltage across R1 (which is the output voltage VOUT) increases.

During steady state operation, a relatively constant voltage difference is maintained across capacitor CC. During a slewing event, the voltage on terminal 121 of capacitor CC decreases and the voltage on terminal 122 of capacitor CC increases, as described above. The voltage difference across capacitor CC causes the capacitor to discharge through M6 and M4 to the ground node. M4 is a current source device meaning its current is limited to a fixed level (the current of tail current source 15). As such, the discharge current from capacitor CC is limited by tail current source 15. The rate of change of voltage across capacitor CC is thus limited by tail current source 15. The terminal 122 of CC (VOUT) thus has a slew rate that is limited by tail current source 15.

Figure 2:
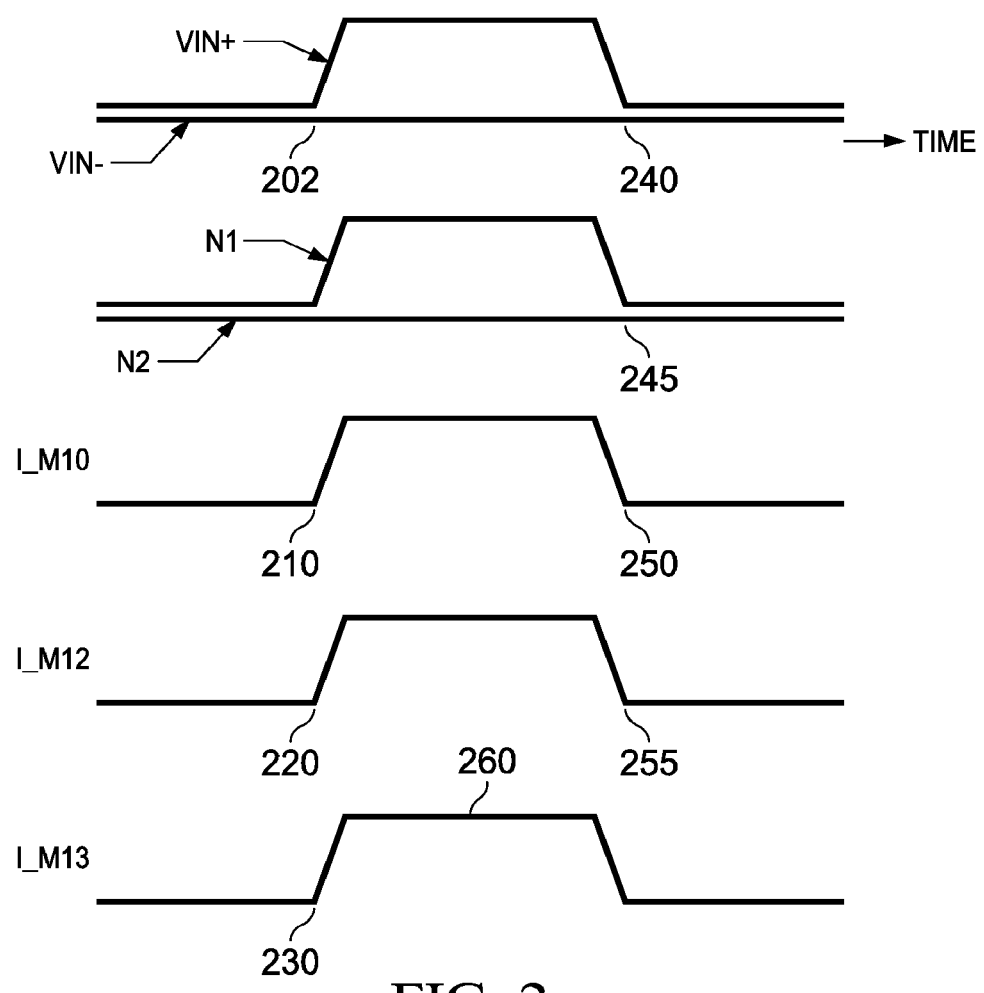
FIG. 2 shows an example timing diagram.

Slew boost circuits 130 and 140 provide an additional discharge current path for capacitor CC, that is, in addition to the current path from tail current source 15 through M3 or M4. FIG. 2 shows a timing diagram illustrating the operation of slew boost circuit 130 when VIN+ has a large positive transition relative VIN−. The waveforms shown in FIG. 2 include the VIN+ and VIN− voltages, the current through M10 (I_M10 as shown in FIG. 1), the current through M12 (I_M12 as shown in FIG. 1), and the current through M13 (I_M13 as shown in FIG. 1). For a class AB output stage, slew boost circuits 130 and 140 help to boost the slew rate when charging and discharging the output capacitor. For a class A output stage, such as that shown in FIG. 1, slew boost circuit 130 helps to boost the slew rate of VOUT. For the class A output stage, slew boost circuit 140 is helpful to maintain symmetry from leakage at the drain of the input transistors M1 and M2 and provides some, but not much, help in boosting the slew rate of VOUT.

Referring to FIGS. 1 and 2, slew boost circuit 130 actively creates a discharge current path for capacitor CC when the gate-to-source voltage (Vgs) of M10 is greater than its threshold voltage, that is, when the voltage on node N1 is larger than the voltage on node N2 (larger by at least the threshold voltage of M10). That will occur during a slew event in which the VIN+ input voltage on input node 113 experiences a large positive transition relative to the VIN− input voltage on input node 111. This divergence between N1 and N2 occurs at 202 in FIG. 2. As a result, M10 is turned on to conduct current from M1 to the drain of M11. FIG. 2 show that I_M10 increases at 210 As explained above M11 and M12 form a current mirror. The ratio of the channel width (W) to channel length (L) of M12 is N times larger than the W/L ratio of M11. Thus, the drain current through M12 will be N times larger than the current through M11. The drain current through M12 is, at least in part, the discharge current from capacitor CC, through M6 to node N2, and from node N2 through M12 to ground. FIG. 2 shows I_M12 increasing at 220. As such, the discharge current from capacitor CC flows through both M4 (which is limited by the current from tail current source 15) and M12. A larger discharge current from CC thus flows due to the slew boost circuit 130 than would have been the case without slew boost circuit 130. A larger discharge current from capacitor CC results in a larger rate of change with respect to time of the voltage across capacitor CC, and thus a larger slew rate of VOUT. Eventually, VIN+ and VIN− re-converge at 240 and the voltages on nodes N1 and N2 also become equal to each other (245), which in turn causes currents I_M10 and I_M12 to decrease as shown at 250 and 255.

The gate and drain of M10 is connected to nodes N2 and N1, respectively. For slew boost circuit 140, the gate and drain of M14 is connected to nodes N1 and N2, respectively, that is, with the opposite polarity as for M10. Thus, when an extra current path to discharge CC forms through slew boost circuit 130 when VIN+ experiences a large positive transition relative to VIN−, M14 is maintained in an off state. As such, no current flows through slew boost circuit 140.

The operation of slew boost circuit 140 when VIN− experiences a large positive transition relative to the VIN+ input voltage on input node largely is similar that described above. As a result, VIN− being more positive than VIN+, the voltage on node N2 will increase and the voltage on node N1 will decrease, which causes M14 to be turned on. Current thus flows from M2 to the drain of M15. M15 and M16 form a current mirror. The W/L ratio of of M16 is N times larger than the W/L ratio of M15. Thus, the drain current through M16 will be N times larger than the current through M15. The drain current through M16 comprises current that flows through M7, through M5, and through M16, and is used to charge capacitor CC. The current through M7 is mirrored through M8 to capacitor CC. As such, the charge current to capacitor CC includes the combination of bias current through M3 and current through M16. A larger charge current to CC thus flows due to the slew boost circuit 140 than would have been the case without slew boost circuit 140. A larger charge current to capacitor CC results in a larger rate of change with respect to time of the voltage across CC, and thus a larger slew rate of VOUT.

When charge current flows through slew boost circuit 140, no current flows through slew boost circuit 130 as a result of the voltage on node N2 being larger than the voltage on node N1. Further, during steady state operation (i.e., VIN+ approximately equals VIN−), the voltage of node N1 approximately equals the voltage of node N2, and thus the Vgs of both M10 and M14 is insufficient to turn on either transistor. As a result, no current flows through slew boost circuits 130 or 140 during steady state operation, and thus the slew boost circuits 130, 140 do not contribute to an increase in quiescent current (beyond that of the bias current from tail current source 15).

With regard to slew boost circuit 130, as capacitor CC discharges in part through M12, eventually, the voltage on node N1 becomes equal to the voltage on node N2, and M10 turns off. At that point, however, it is possible that the voltage on the drain of M11 will be greater than zero due to the capacitance on the drain of M11 remaining charged to a voltage greater than 0 v during the slew boosting phase. As M11 will operate in the subthreshold region for a gate voltage smaller than the transistor's threshold voltage, the impedance will be higher on the drain of M11 which results in a longer discharge time for the gate of M11. In this subthreshold region for M11, a small amount of current will flow through M11 and the M11 drain voltage will slowly decay to zero (the time decay is in part of a function the capacitance within M11. Due to the current mirror formed by M11 and M12, a current may also flow through M12 thereby creating an offset current between the input transistor pair M1 and M2. To avoid this offset, M13 is included within slew boost circuit 130. M13 is biased on. In one example, M13 may be part of a current mirror where the other transistor in the current mirror is a current source device, which thus causes a current to flow through M13 if the voltage on M11 is greater than zero. M13 thus provides a current bypass path for current to flow to ground instead of through M11 and M12. As a result of current flow through M13 (as shown at 260 in FIG. 2), the drain voltage of M11 decays very rapidly to zero. Transistor M17 functions similarly within slew boost circuit 140.

In this description, the term "couple" or "couples" means either an indirect or direct connection. Thus, if a first device couples to a second device, that connection may be through a direct connection or through an indirect connection via other devices and connections. Modifications are possible in the described embodiments, and other embodiments are possible, within the scope of the claims.

What is claimed is:

1. A circuit, comprising:
    an input stage coupled to a first node and a second node;
    a first slew boost circuit including a first transistor and a first current mirror, a first terminal of the first transistor coupled to the second node, a second terminal of the first transistor coupled to the first node, the first current mirror coupled to the first transistor and to the second node; and
    a second slew boost circuit including a second transistor and a second current mirror, a first terminal of the second transistor coupled to the first node, a second terminal of the second transistor coupled to the second node, the second current mirror coupled to the second transistor and to the first node.

2. The circuit of claim 1, further including a third transistor having a first terminal coupled to a third terminal of the first transistor and a second terminal coupled to a ground node.

3. The circuit of claim 2, further including an fourth transistor having a first terminal coupled to a third terminal of the second transistor and a second terminal coupled to a ground node.

4. The circuit of claim 1, wherein:
    the first current mirror includes a first current mirror transistor and a second current mirror transistor, the first and second current mirror transistors having a first terminal coupled together, the first and second current mirror transistors having a second terminal coupled together, a third terminal of the first transistor is coupled to a third terminal and the first terminal of the first current mirror transistor, and a third terminal of the second current mirror transistor is coupled to the first terminal of the first transistor and to the second node.

5. The circuit of claim 4, wherein:
    the second current mirror includes a third current mirror transistor and a fourth current mirror transistor, the third and fourth current mirror transistors having a first terminal coupled together, the third and fourth current mirror transistors having a second terminal coupled together, a third terminal of the second transistor is coupled to a third terminal and the first terminal of the third current mirror transistor, and a third terminal of the fourth current mirror transistor is coupled to the first terminal of the second transistor and to the first node.

6. The circuit of claim 1, further comprising a class A output stage.

7. A circuit, comprising:
    a first slew boost circuit including a first transistor and a first current mirror, the first transistor having a first control input, a first current terminal, and a second current terminal, the first current terminal coupled to a first node, the first control input coupled to a second node, the first current mirror coupled to the first transistor and to the second node; and
    a second slew boost circuit including a second transistor and a second current mirror, the second transistor having a second control input, a third current terminal and a fourth current terminal, the second control input coupled to the first node, the third current terminal coupled to the second node, the second current mirror coupled to the second transistor and to the first node.

8. The circuit of claim 7, further including a seventh transistor coupled to a ground node and to the first transistor.

9. The circuit of claim 8, further including an eighth transistor coupled to a ground node and to the second transistor.

10. The circuit of claim 7, wherein the first current mirror includes:
    a first current mirror transistor having a third control input and a first pair of current terminals,
    a second current mirror transistor having a fourth control input and a second pair of current terminals;

the third and fourth control inputs are coupled together;

one of the first pair of current terminals and one of the second pair of current terminals are coupled together;

the first transistor is coupled to the third and fourth control inputs and to one of the first pair of current terminals; and one of the second pair of current terminals is coupled to the first control input and to the second node.

11. The circuit of claim 10, wherein the second current mirror includes:

a third current mirror transistor having a fifth control input and a third pair of current terminals a fourth current mirror transistor having a sixth control input and a fourth pair of current terminals the fifth and sixth control inputs are coupled together;

one of the third pair of current terminals and one of the fourth pair of current terminals are coupled together;

the second transistor is coupled to the fifth and sixth control inputs and to the one of the third pair of current terminals; and one of the fourth pair of current terminals is coupled to the second control input and to the first node.

12. The circuit of claim 7, further comprising an output stage coupled to a differential input stage.

13. The circuit of claim 12, wherein the output stage comprises a class A or class AB output stage.

14. The circuit of claim 7, wherein the first and second transistors comprise metal oxide semiconductor field effect transistor.

15. A circuit, comprising:

a first slew boost circuit coupled to a first node, a second node, and a ground node, wherein, responsive to a first, non-zero voltage polarity between the first and second nodes, the first slew boost circuit is configured to provide a first current path to the ground node, wherein the first slew boost circuit includes a first transistor and a first current mirror; and a second slew boost circuit coupled to the first and second nodes and to the ground node, wherein, responsive to a second, non-zero voltage polarity between the first and second nodes, the second slew boost circuit is configured to provide a second current path to the ground node, the second, non-zero polarity opposite the polarity of the first, non-zero polarity.

16. The circuit of claim 15, wherein the first slew boost circuit includes a second transistor coupled between the first transistor and the ground node.

17. The circuit of claim 15, wherein the second slew boost circuit includes a second transistor and a second current mirror.

18. The circuit of claim 17, wherein:

the first slew boost circuit includes a third transistor coupled between the first transistor and the ground node; and the second slew boost circuit includes a fourth transistor coupled between the first transistor and the ground node.

19. The circuit of claim 15, further comprising an output stage having a capacitor, and the first and second current paths include the capacitor.

20. The circuit of claim 15, further comprising an input stage coupled to the first slew boost circuit and the second slew boost circuit at the first node and the second node.

* * * * *